(12) United States Patent
Sun et al.

(10) Patent No.: US 11,502,531 B2
(45) Date of Patent: Nov. 15, 2022

(54) METHOD AND DEVICE FOR ESTIMATING REMAINING CHARGING TIME OF BATTERY, AND BATTERY MANAGEMENT SYSTEM

(71) Applicant: CONTEMPORARY AMPEREX TECHNOLOGY CO., LIMITED, Ningde (CN)

(72) Inventors: Shuting Sun, Ningde (CN); Haijiang Wang, Ningde (CN); Wei Zhao, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 0 days.

(21) Appl. No.: 17/364,971

(22) Filed: Jul. 1, 2021

(65) Prior Publication Data
US 2022/0329094 A1      Oct. 13, 2022

Related U.S. Application Data

(63) Continuation of application No. PCT/CN2021/084752, filed on Mar. 31, 2021.

(51) Int. Cl.
*H02J 7/00*      (2006.01)
*G01R 31/36*      (2020.01)
(Continued)

(52) U.S. Cl.
CPC ........ *H02J 7/0049* (2020.01); *G01R 31/3648* (2013.01); *H01M 10/443* (2013.01);
(Continued)

(58) Field of Classification Search
CPC .... H02J 7/0048; H02J 7/0049; H02J 7/00718; G01R 31/3648; H01M 10/443;
(Continued)

(56) References Cited

U.S. PATENT DOCUMENTS

| | | | | |
|---|---|---|---|---|
| 2008/0238355 A1* | 10/2008 | Muramatsu | ....... | H01M 8/04955 320/101 |
| 2010/0045242 A1* | 2/2010 | Nagashima | ............. | H02J 7/027 320/157 |

(Continued)

FOREIGN PATENT DOCUMENTS

| CN | 107192960 A | 9/2017 |
|---|---|---|
| CN | 111257752 A | 6/2020 |

(Continued)

OTHER PUBLICATIONS

International Search Report of Application No. PCT/CN2021/084752, dated Jan. 6, 2022, 4 pages.

*Primary Examiner* — Zixuan Zhou
(74) *Attorney, Agent, or Firm* — Ladas & Parry LLP

(57) ABSTRACT

This application provides a method and a device for estimating a remaining charging time of a battery, and a battery management system. The method includes: determining a minimum charging time of each type of battery cell at a $K^{th}$ charging phase based on a charge request current value of each type of battery cell at the $K^{th}$ charging phase; and determining the remaining charging time of the battery when the $K^{th}$ charging phase of any type of battery cell in the battery is a target state-of-charge phase, where the remaining charging time of the battery is a smallest one of accumulation values, each accumulation value being an accumulation of minimum charging times of a type of battery cell in the battery at all charging phases.

15 Claims, 2 Drawing Sheets

(51) Int. Cl.
  *H01M 10/44* (2006.01)
  *H01M 10/42* (2006.01)
(52) U.S. Cl.
  CPC ........ *H02J 7/0048* (2020.01); *H02J 7/00718* (2020.01); *H01M 2010/4271* (2013.01)
(58) Field of Classification Search
  CPC ......... H01M 2010/4271; H01M 10/44; H01M 10/03; B60L 53/00; B60L 53/50; B60L 53/51; B60L 53/52; B60L 53/53; B60L 53/54; B60L 53/55; B60L 53/56; B60L 53/57; B60L 53/67; B60L 53/68; B60L 53/10; B60L 53/62; B60L 53/66; B60L 53/12; B60L 53/122
  USPC .................................. 320/104, 109, 132, 106
  See application file for complete search history.

(56) References Cited

U.S. PATENT DOCUMENTS

| | | | |
|---|---|---|---|
| 2012/0098500 A1* | 4/2012 | Vestama | H02J 7/0047 320/149 |
| 2015/0326037 A1* | 11/2015 | Borhan | B60L 53/11 320/162 |
| 2016/0141730 A1* | 5/2016 | Shin | H01M 10/425 429/7 |
| 2018/0043785 A1* | 2/2018 | Takatsuka | H01M 10/44 |
| 2019/0184846 A1* | 6/2019 | Kang | H02J 7/007194 |
| 2020/0185928 A1* | 6/2020 | Ha | B60L 53/62 |

FOREIGN PATENT DOCUMENTS

| | | | |
|---|---|---|---|
| JP | 11089105 A | * | 3/1999 |
| JP | 2006333553 A | | 12/2006 |

* cited by examiner

METHOD AND DEVICE FOR ESTIMATING REMAINING CHARGING TIME OF BATTERY, AND BATTERY MANAGEMENT SYSTEM

CROSS-REFERENCE TO RELATED APPLICATIONS

This application is a continuation of International Patent Application No. PCT/CN2021/084752, filed on Mar. 31, 2021, which is incorporated herein by reference in its entirety.

TECHNICAL FIELD

This application relates to the technical field of batteries, and in particular, to a method and device for estimating a remaining charging time of a battery, and a battery management system.

BACKGROUND

With the evolution of technology, users have raised higher requirements on the intelligence of electric devices. For example, when charging an electric vehicle, the users expect to be aware of a remaining charging time of a battery. As a means of status estimation in a charging process, the remaining charging time can help a user make better scheduling. Therefore, it is essential to display the remaining charging time to the user in the charging process.

However, with the development of the battery industry, it is more prevalent that one battery includes a variety of battery cells. Currently, estimation algorithms such as an ampere-hour integral method that are commonly used in most technologies for estimating the remaining charging time are merely applicable to a battery that contains a single type of battery cell, and are unable to provide an accurate estimate of the remaining charging time for a battery containing different types of battery cells.

SUMMARY

An objective of embodiments of this application is to provide a method and a device for estimating a remaining charging time of a battery, and a battery management system to accurately estimate the remaining charging time of a battery containing different types of battery cells.

According to a first aspect, an embodiment of this application provides a method for estimating a remaining charging time of a battery. The battery includes N types of battery cells, N≥2, and the method includes: determining a minimum charging time of each type of battery cell at a $K^{th}$ charging phase based on a charge request current value of each type of battery cell at the $K^{th}$ charging phase, where the charge request current value of each type of battery cell at the $K^{th}$ charging phase is determined based on an initial state of charge and an initial temperature of said type of battery cell at said charging phase; and determining the remaining charging time of the battery when the $K^{th}$ charging phase of any type of battery cell in the battery is a target state-of-charge phase, where the remaining charging time of the battery is a smallest one of accumulation values, each accumulation value being an accumulation of minimum charging times of a type of battery cell in the battery at all charging phases.

In the method for estimating a remaining charging time of a battery according to this embodiment of this application, the minimum charging time of each type of battery cell at each charging phase is determined based on the charge request current value of each type of battery cell at each charging phase. When one of the types of battery cells reaches a target state of charge, an accumulation value of minimum charging times of each type of battery cell at all charging phases is calculated so that a plurality of accumulation values are obtained, and a smallest one of the accumulation values is used as the remaining charging time of the battery. In this way, the remaining charging time of a battery containing different types of battery cells can be estimated. In this embodiment of this application, the estimation is performed in phases, and impact exerted by a temperature change on the calculation of the remaining charging time is also considered, thereby further improving accuracy of the estimation of the remaining charging time of the battery containing different types of battery cells.

With reference to the technical solution provided in the first aspect above, in some possible implementations, when the $K^{th}$ charging phase of none of the battery cells in the battery is the target state-of-charge phase, the method further includes: determining the initial state of charge of each type of battery cell at a $(K+1)^{th}$ charging phase and the initial temperature of each type of battery cell at the $(K+1)^{th}$ charging phase based on the minimum charging time of each type of battery cell at the $K^{th}$ charging phase, the initial state of charge of each type of battery cell at the $K^{th}$ charging phase, and the initial temperature of each type of battery cell at the $K^{th}$ charging phase; determining the charge request current value of each type of battery cell at the $(K+1)^{th}$ charging phase based on the initial state of charge of each type of battery cell at the $(K+1)^{th}$ charging phase and the initial temperature of each type of battery cell at the $(K+1)^{th}$ charging phase; and determining the minimum charging time of each type of battery cell at the $(K+1)^{th}$ charging phase based on the charge request current value of each type of battery cell at the $(K+1)^{th}$ charging phase.

In this embodiment of this application, when the $K^{th}$ charging phase of none of the battery cells in the battery is the target state-of-charge phase, the minimum charging time of each type of battery cell at a next charging phase is determined based on the minimum charging time of each type of battery cell at the current charging phase, the initial state of charge of each type of battery cell at the current charging phase, and the initial temperature of each type of battery cell at the current charging phase. In this way, the minimum charging time at each phase can be determined separately to facilitate subsequent statistics of the remaining charging times.

With reference to the technical solution provided in the first aspect above, in some possible implementations, the battery includes a first type of battery cell and a second type of battery cell. The minimum charging time of the battery cell in the battery at the $K^{th}$ charging phase is determined by performing the following steps, the battery cell in the battery is the first type of battery cell or the second type of battery cell, and the steps include: obtaining a current value of the battery cell in the battery at the $K^{th}$ charging phase, where the current value is the charge request current value of the first type of battery cell at the $K^{th}$ charging phase or the charge request current value of the second type of battery cell at the $K^{th}$ charging phase, whichever is smallest; and determining the minimum charging time of the battery cell in the battery at the $K^{th}$ charging phase based on the current value of the battery cell in the battery at the $K^{th}$ charging phase.

In this embodiment of this application, the current value of the battery cell in the battery at the $K^{th}$ charging phase is determined based on the charge request current value of the first type of battery cell at the $K^{th}$ charging phase or the charge request current value of the second type of battery cell at the $K^{th}$ charging phase, whichever the smallest. In this way, the minimum charging time of the battery cell in the battery at the $K^{th}$ charging phase can be determined accurately, so as to implement accurate estimation of the remaining charging time of the battery containing two types of battery cells.

With reference to the technical solution provided in the first aspect above, in some possible implementations, when K=1, the obtaining a current value of the battery cell in the battery at a first charging phase includes: obtaining a current state of charge of the first type of battery cell and a current temperature of the first type of battery cell, where the current state of charge of the first type of battery cell is the initial state of charge of the first type of battery cell at the first charging phase, and the current temperature of the first type of battery cell is the initial temperature of the first type of battery cell at the first charging phase; obtaining a current state of charge of the second type of battery cell and a current temperature of the second type of battery cell, where the current state of charge of the second type of battery cell is the initial state of charge of the second type of battery cell at the first charging phase, and the current temperature of the second type of battery cell is the initial temperature of the second type of battery cell at the first charging phase; determining the charge request current value of the first type of battery cell at the first charging phase based on the current state of charge of the first type of battery cell and the current temperature of the first type of battery cell; and determining the charge request current value of the second type of battery cell at the first charging phase based on the current state of charge of the second type of battery cell and the current temperature of the second type of battery cell, where the current value of the battery cell in the battery at the first charging phase is the charge request current value of the first type of battery cell or the charge request current value of the second type of battery cell, whichever is smallest.

In this embodiment of this application, when K=1, the current state of charge of each type of battery cell and the current temperature of each type of battery cell are used as an initial value, so as to accurately determine the current value of the battery cell in the battery at the first charging phase.

With reference to the technical solution provided in the first aspect above, in some possible implementations, when K>1, the obtaining a current value of the battery cell in the battery at the $K^{th}$ charging phase includes: obtaining the minimum charging time of the first type of battery cell at a $(K-1)^{th}$ charging phase, the initial state of charge of the first type of battery cell at the $(K-1)^{th}$ charging phase, and the initial temperature of the first type of battery cell at the $(K-1)^{th}$ charging phase; obtaining the minimum charging time of the second type of battery cell at the $(K-1)^{th}$ charging phase, the initial state of charge of the second type of battery cell at the $(K-1)^{th}$ charging phase, and the initial temperature of the second type of battery cell at the $(K-1)^{th}$ charging phase; determining the initial state of charge and the initial temperature of the first type of battery cell at the $K^{th}$ charging phase based on the minimum charging time of the first type of battery cell at the $(K-1)^{th}$ charging phase, the initial state of charge of the first type of battery cell at the $(K-1)^{th}$ charging phase, and the initial temperature of the first type of battery cell at the $(K-1)^{th}$ charging phase; determining the initial state of charge and the initial temperature of the second type of battery cell at the $K^{th}$ charging phase based on the minimum charging time of the second type of battery cell at the $(K-1)^{th}$ charging phase, the initial state of charge of the second type of battery cell at the $(K-1)^{th}$ charging phase, and the initial temperature of the second type of battery cell at the $(K-1)^{th}$ charging phase; determining the charge request current value of the first type of battery cell at the $K^{th}$ charging phase based on the initial state of charge and the initial temperature of the first type of battery cell at the $K^{th}$ charging phase; and determining the charge request current value of the second type of battery cell at the $K^{th}$ charging phase based on the initial state of charge and the initial temperature of the second type of battery cell at the $K^{th}$ charging phase, where the current value of the battery cell in the battery at the $K^{th}$ charging phase is the charge request current value of the first type of battery cell at the $K^{th}$ charging phase or the charge request current value of the second type of battery cell at the $K^{th}$ charging phase, whichever is smallest.

In this embodiment of this application, when K>1, the initial state of charge and the initial temperature at the current phase are determined separately based on the minimum charging time, the initial state of charge, and the initial temperature of each type of battery cell at a previous phase, so as to determine the charge request current value of each type of battery cell at the current phase. In this way, continuity of the estimation at all phases is ensured, and estimation precision is improved.

With reference to the technical solution provided in the first aspect above, in some possible implementations, the determining the minimum charging time of the battery cell in the battery at the $K^{th}$ charging phase based on the current value of the battery cell in the battery at the $K^{th}$ charging phase includes: determining a temperature change rate of the battery cell in the battery based on the current value and the initial temperature of the battery cell in the battery at the $K^{th}$ charging phase; determining a required charging time of the battery cell in the battery at a current temperature phase based on the temperature change rate; and determining a required charging time of the battery cell in the battery at a current state-of-charge phase based on the current value of the battery cell in the battery at the $K^{th}$ charging phase, where the minimum charging time of the battery cell in the battery at the $K^{th}$ charging phase is the required charging time of the battery cell in the battery at the current temperature phase or the required charging time of the battery cell in the battery at the current state-of-charge phase, whichever is smallest.

In this embodiment of this application, the estimation is performed in phases, and impact exerted by a temperature change on the calculation of the remaining charging time is also considered. Through the accurate calculation of the temperature phase, this embodiment further improves accuracy of the estimation of the remaining charging time of the battery containing different types of battery cells.

With reference to the technical solution provided in the first aspect above, in some possible implementations, the battery includes a first type of battery cell, a second type of battery cell, and a third type of battery cell, and the minimum charging time of the battery cell in the battery at the $K^{th}$ charging phase is determined by performing the following steps, the battery cell in the battery is one of the first type of battery cell, the second type of battery cell, or the third type of battery cell, and the steps include: obtaining a current value of the battery cell in the battery at the $K^{th}$ charging phase, where the current value is the charge request current value of the first type of battery cell at the $K^{th}$ charging phase, or the charge request current value of the second type of battery cell at the $K^{th}$ charging phase, or the charge request current value of the third type of battery cell at the $K^{th}$ charging phase, whichever is smallest; and determining the minimum charging time of the battery cell in the battery at the $K^{th}$ charging phase based on the current value of the battery cell in the battery at the $K^{th}$ charging phase.

In this embodiment of this application, the current value of the battery cell in the battery at the $K^{th}$ charging phase is determined based on the charge request current value of the first type of battery cell at the $K^{th}$ charging phase, or the charge request current value of the second type of battery cell at the $K^{th}$ charging phase, or the charge request current value of the third type of battery cell at the $K^{th}$ charging phase, whichever is smallest. In this way, the minimum charging time of the battery cell in the battery at the $K^{th}$ charging phase can be determined accurately, so as to implement accurate estimation of the remaining charging time of the battery containing three types of battery cells.

According to a second aspect, an embodiment of this application provides a device for estimating a remaining charging time of a battery. The battery includes N types of battery cells, N≥2, and the device includes: a determining module, configured to determine a minimum charging time of each type of battery cell at a $K^{th}$ charging phase based on a charge request current value of each type of battery cell at the $K^{th}$ charging phase, where the charge request current value of each type of battery cell at the $K^{th}$ charging phase is determined based on an initial state of charge and an initial temperature of said type of battery cell at said charging phase; and an estimation module, configured to determine the remaining charging time of the battery when the $K^{th}$ charging phase of any type of battery cell in the battery is a target state-of-charge phase, where the remaining charging time of the battery is a smallest one of accumulation values, each accumulation value being an accumulation of minimum charging times of a type of battery cell in the battery at all charging phases.

According to a third aspect, an embodiment of this application provides an electronic device, including a processor and a memory. The processor is connected to the memory. The memory is configured to store a program. The processor is configured to call the program stored in the memory, and perform the method according to the embodiment of the first aspect and/or with reference to some possible implementations of the embodiment of the first aspect.

According to a fourth aspect, an embodiment of this application provides a computer-readable storage medium on which a computer program is stored. When executed by a processor, the computer program implements the method according to the embodiment of the first aspect and/or with reference to some possible implementations of the embodiment of the first aspect.

BRIEF DESCRIPTION OF DRAWINGS

To describe the technical solutions in the embodiments of this application more clearly, the following outlines the drawings used in the embodiments of this application. Evidently, the drawings outlined below are merely a part of embodiments of this application. A person of ordinary skill in the art may derive other drawings from the outlined drawings without making any creative efforts.

The drawings are not drawn to scale.

DETAILED DESCRIPTION OF EMBODIMENTS

The following gives a more detailed description of implementations of this application with reference to accompanying drawings and embodiments. The detailed description of the following embodiments and the accompanying drawings are intended to exemplarily describe the principles of this application, but not to limit the scope of this application. Therefore, this application is not limited to the described embodiments.

Currently, estimation algorithms such as an ampere-hour integral method that are commonly used in most technologies for estimating the remaining charging time are merely applicable to a battery that contains a single type of battery cell, and are unable to provide an accurate estimate of the remaining charging time for a battery containing different types of battery cells. In view of this, after research and exploration, this application puts forward the following embodiments to solve such problems.

Figure 1:
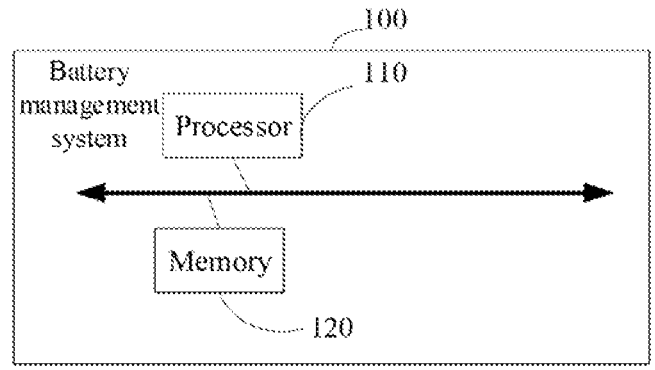
FIG. 1 is a schematic structural diagram of a battery management system according to an embodiment of this application.

Refer to FIG. 1, which is a schematic structural diagram of a battery management system 100 that applies a method for estimating a remaining charging time of a battery according to an embodiment of this application. The battery management system 100 may be disposed in a device such as an electric vehicle, an unmanned aerial vehicle, and an unmanned ship.

Structurally, the battery management system 100 includes a processor 110 and a memory 120.

The processor 110 is electrically connected to the memory 120 directly or indirectly to implement data transmission or interaction. For example, such components may be electrically connected to each other by one or more communications buses or signal cables. The method includes at least one software module that can be stored in the memory 120 or built in the battery management system 100 in the form of software or firmware. The processor 110 is configured to execute an executable module stored in the memory 120. The processor 110 may execute a computer program after receiving an execution instruction.

The processor 110 may be an integrated circuit chip capable of processing signals. The processor 110 may also be a general-purpose processor, and may be, for example, a digital signal processor (DSP), an application specific integrated circuit (ASIC), a discrete gate or a transistor logic device, or a discrete hardware component, and can implement or perform the methods, steps, and logical block diagrams disclosed in the embodiments of this application. In addition, the general-purpose processor may be a microprocessor, or any conventional processor or the like.

The memory 120 may be, but is not limited to, a random access memory (RAM), a read-only memory (ROM), a programmable read-only memory (PROM), an erasable programmable read-only memory (EPROM), or an electric erasable programmable read-only memory (EEPROM). The memory 120 is configured to store a program. The processor 110 executes the program after receiving an execution instruction.

It needs to be noted that the structure shown in FIG. 1 is merely illustrative. The battery management system 100 provided in this embodiment of this application may include fewer or more components than that shown in FIG. 1, or may have a configuration different from that shown in FIG. 1. In addition, the components shown in FIG. 1 may be implemented by software, hardware, or a combination thereof.

In this embodiment of this application, the battery management system 100 is connected to different types of battery cells in a battery. Assuming that the battery includes N types of battery cells, the battery management system 100 is connected to the N (N≥2) types of battery cells in the battery. The battery management system 100 is configured to estimate a charging time of each of the N battery cells at each charging phase, and estimate a remaining charging time of the entire battery based on this.

Figure 2:
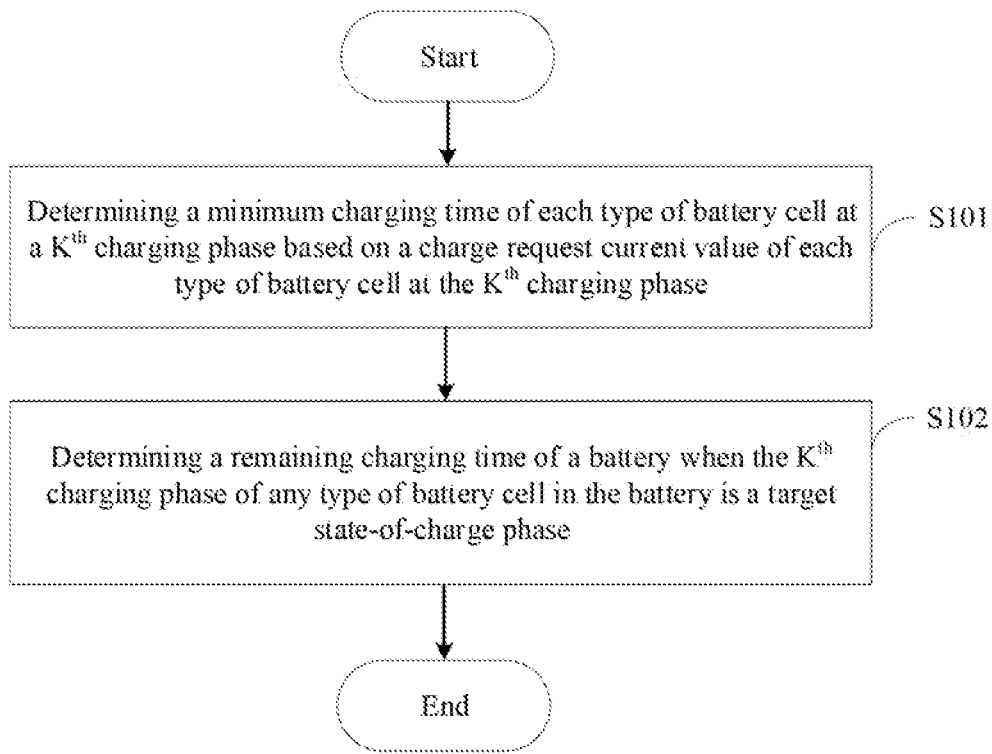
FIG. 2 is a flowchart of steps of a method for estimating a remaining charging time of a battery according to an embodiment of this application.

Specifically, referring to FIG. 2, FIG. 2 is a step-by-step flowchart of a method for estimating a remaining charging time of a battery according to an embodiment of this application. It needs to be noted that the method for estimating a remaining charging time of a battery according to this embodiment of this application is not limited to the sequence shown in FIG. 2 or the sequence described below. The method includes steps S101 to S102.

S101: Determining a minimum charging time of each type of battery cell at a $K^{th}$ charging phase based on a charge request current value of each type of battery cell at the $K^{th}$ charging phase.

The charge request current value of each type of battery cell at the $K^{th}$ charging phase is determined based on an initial state of charge and an initial temperature of said type of battery cell at said charging phase.

The charge request current value may be found in a pre-created two-dimensional table of charge request current values corresponding to states of charge and temperatures of the battery cell. Refer to Table 1.

TABLE 1

| T | I | \multicolumn{6}{c}{SOC} |
|---|---|---|---|---|---|---|---|
| | | 10%~20% | 20%~30% | 30%~40% | 40%~50% | ... | 90%~100% |
| −30° C.~−20° C. | | $I_1$ | $I_2$ | $I_3$ | $I_4$ | $I_5$ | $I_6$ |
| −20° C.~−10° C. | | $I_7$ | ... | ... | ... | ... | ... |
| −10° C.~0° C. | | $I_8$ | ... | ... | ... | ... | ... |
| 0° C.~10° C. | | $I_9$ | ... | ... | ... | ... | ... |
| ... | | ... | ... | ... | ... | ... | ... |
| 50° C.~60° C. | | $I_{10}$ | $I_{11}$ | $I_{12}$ | $I_{13}$ | $I_{14}$ | $I_{15}$ |

It needs to be noted that Table 1 is a two-dimensional table of the state of charge and the temperature of just one of the battery cells. In the table. T represents a temperature, I represents a charge request current value, and SOC represents a state of charge.

Using Table 1 as an example, when an initial state of charge of a battery cell corresponding to Table 1 at the $K^{th}$ charging phase is 35% and an initial temperature is −25° C., the charge request current value of the battery cell at the $K^{th}$ charging phase is $I_3$.

The two-dimensional table of charge request current values corresponding to states of charge and temperatures of the battery cell according to this embodiment of this application is not limited to the example shown in Table 1. In addition, the charge request current value of each type of battery cell at the $K^{th}$ charging phase may also be used in combination with a capacity of a charging pile and consumption of other loads. This is not limited in this application.

S102: Determining the remaining charging time of the battery when the $K^{th}$ charging phase of any type of battery cell in the battery is a target state-of-charge phase.

The remaining charging time of the battery is a smallest one of accumulation values, each accumulation value being an accumulation of minimum charging times of a type of battery cell in the battery at all charging phases. For example, if a $K^{th}$ charging phase of an $a^{th}$ battery cell in N battery cells is a target state-of-charge phase, an accumulation value of minimum charging times of each of the N battery cells at all charging phases is obtained so that N accumulation values are obtained, and a smallest one of the N accumulation values is determined to be the remaining charging time of the battery.

It needs to be noted that the state of charge (SC) is a relative measure of energy stored in the battery, and is defined as a ratio of the amount of charge extractable from the battery at a specific time point relative to a total capacity of the battery. A state of charge of 100% indicates a full charge state, and a state of charge of 0% indicates a full discharge state. The target state of charge may be 100%, 90%, or 80%, and this application does not limit the value of the state of charge. Correspondingly, when the target state of charge is set to 100%, the determined remaining charging time of the battery is the remaining charging time required to charge the battery to 100%. When the target state of charge is set to 90%, the determined remaining charging time of the battery is the remaining charging time required to charge the battery to 90%.

In conclusion, in the method for estimating a remaining charging time of a battery according to this embodiment of this application, the minimum charging time of each type of battery cell at each charging phase is determined based on the charge request current value of each type of battery cell at each charging phase. When one of the types of battery cells reaches a target state of charge, an accumulation value of minimum charging times of each type of battery cell at all charging phases is calculated so that a plurality of accumulation values are obtained, and a smallest one of the accumulation values is used as the remaining charging time of the battery. In this way, the remaining charging time of a battery containing different types of battery cells can be estimated. In this application, the estimation is performed in phases, and impact exerted by a temperature change on the calculation of the remaining charging time is also considered, thereby further improving accuracy of the estimation of the remaining charging time of the battery containing different types of battery cells.

In this embodiment of this application, when the $K^{th}$ charging phase of none of the battery cells in the battery is the target state-of-charge phase, the minimum charging time of the battery cell in the battery at a $(K+1)^{th}$ charging phase is determined based on the minimum charging time of each type of battery cell at the $K^{th}$ charging phase, the initial temperature of each type of battery cell at the $K^{th}$ charging phase, and the initial state of charge of each type of battery cell at the $K^{th}$ charging phase.

A specific process of determining the minimum charging time at the $(K+1)^{th}$ charging phase includes: determining the initial state of charge of each type of battery cell at the $(K+1)^{th}$ charging phase and the initial temperature of each type of battery cell at the $(K+1)^{th}$ charging phase based on the minimum charging time of each type of battery cell at the $K^{th}$ charging phase, the initial state of charge of each type of battery cell at the $K^{th}$ charging phase, and the initial temperature of each type of battery cell at the $K^{th}$ charging phase; determining the charge request current value of each type of battery cell at the $(K+1)^{th}$ charging phase based on the initial state of charge of each type of battery cell at the $(K+1)^{th}$ charging phase and the initial temperature of each type of battery cell at the $(K+1)^{th}$ charging phase; and finally, determining the minimum charging time of each type of battery cell at the $(K+1)^{th}$ charging phase based on the charge request current value of each type of battery cell at the $(K+1)^{th}$ charging phase.

In other words, when the $K^{th}$ charging phase of none of the battery cells in the battery is the target state-of-charge phase, the minimum charging time of each type of battery cell at the $(K+1)^{th}$ charging phase is determined based on parameters (including the minimum charging time, the initial temperature, and the initial state of charge) of each type of battery cell at the $K^{th}$ charging phase. It needs to be noted that, when K is 1, the battery management system directly obtains a current state of charge and a current temperature of each type of battery cell, and uses the current state of charge and the current temperature of each type of battery cell as an initial state of charge and an initial temperature of each type of battery cell at the first charging phase. Then, the battery management system determines a charge request current value of each type of battery cell at the first charging phase based on the initial state of charge and the initial temperature of each type of battery cell at the first charging phase, and then determines the minimum charging time of each type of battery cell at the first charging phase based on the charge request current value of each type of battery cell at the first charging phase. When the first charging phase of none of the battery cells in the battery is the target state-of-charge phase, the initial state of charge, the initial temperature, and the minimum charging time of the battery cells in the battery at a second charging phase is calculated based on the initial state of charge, the initial temperature, and the minimum charging time of the battery cells in the battery at the first charging phase. By analogy, the corresponding initial state of charge, initial temperature, and minimum charging time of the battery cells in the battery at a third charging phase, a fourth charging phase, and a fifth charging phase are calculated until a charging phase of any type of battery cell in the battery is the target state-of-charge stage, whereupon the calculation stops. In this way, the minimum charging time at each phase can be determined one by one, so that the remaining charging time can be determined subsequently based on statistics.

Optionally, the determining the minimum charging time of each type of battery cell at the $K^{th}$ charging phase based on the charge request current value of each type of battery cell at the $K^{th}$ charging phase is specifically: determining the minimum charging time of each type of battery cell at the K charging phase based on a smallest one of charge request current values of all types of battery cells at the $K^{th}$ charging phase.

Optionally, the determining the minimum charging time of each type of battery cell at the $K^{th}$ charging phase based on a smallest one of charge request current values of all types of battery cells at the $K^{th}$ charging phase includes: determining a required charging time of each type of battery cell at a current temperature phase and a required charging time of each type of battery cell at a current state-of-charge phase based on the smallest one of the charge request current values of all types of battery cells at the $K^{th}$ charging phase. The required charging time at the current temperature phase or the required charging time at the current state-of-charge phase, whichever is smallest, serves as the minimum charging time of each type of battery cell at the $K^{th}$ charging phase.

A calculation formula for determining the required charging time of the battery cell at the current state-of-charge phase based on the smallest one of charge request current values of all types of battery cells at the $K^{th}$ charging phase is:

$$T_{SOC} = \frac{SOC_i - SOC_{i-1}}{I} C \qquad (1)$$

In Formula (1), $T_{soc}$ represents the required charging time of a battery cell at an $i^{th}$ state-of-charge phase, $SOC_i$ represents an upper limit of a fluctuation range of state of charge at the $i^{th}$ state-of-charge phase, $SOC_{i-1}$ represents an initial state of charge of the battery cell at the $K^{th}$ charging phase, the initial state of charge of the battery cell at the $K^{th}$ charging phase belongs to the $i^{th}$ state-of-charge phase, I represents the smallest one of charge request current values of all types of battery cells at the $K^{th}$ charging phase, and C represents a capacity of the battery cell.

A calculation formula for determining the required charging time of the battery cell at the current temperature phase based on the smallest one of charge request current values of all types of battery cells at the $K^{th}$ charging phase is:

$$T_{temperature} = \frac{T_j - T_{j-1}}{Trate_j} \qquad (2)$$

In Formula (2), $T_{temperature}$ represents the required charging time of the battery cell at an $j^{th}$ temperature phase, $T_j$ represents an upper limit of a fluctuation range of a temperature at the $j^{th}$ temperature phase, $T_{j-1}$ represents an initial temperature of the battery cell at the $K^{th}$ charging phase, the initial temperature of the battery cell at the $K^{th}$ charging phase belongs to the $j^{th}$ temperature phase, and $Trate_j$ represents a temperature change rate of the battery when the temperature rises from the initial temperature of the battery cell at the $K^{th}$ charging phase to the upper limit $T_j$.

Optionally, in this embodiment of this application, the temperature change rate of the battery cell is obtained based on a temperature model according to a current temperature, a current charge request current value, and a thermal management state of the battery cell. In addition, the temperature change rate may also be obtained from a pre-created correspondence table of the state of charge of the battery cell, the temperature of the battery cell, and the temperature change rate of the battery cell. This is not limited in this application.

Because both the state of charge and the temperature of the battery cell change in a charging process, the fluctuation range of the state of charge and the fluctuation range of the temperature are set in advance. It is assumed that fluctuation ranges of the state of charge are set to 0%~20%, 20%~40%, 40%~60%, 60%~80%, and 80%~100%; and fluctuation ranges of the temperature are set to −30° C.~−15° C., −15° C.~0° C., 0° C.~15° C., 15° C.~30° C., and 30° C.~45° C. If the initial state of charge of type-A battery cell at the $K^{th}$ charging phase is 50% and the initial temperature is 5° C., then the charging time required to charge the type-A battery cell from the state of charge of 50% to the upper limit 60% of the fluctuation range is calculated according to Formula (1) above, and the charging time required to charge the type-A battery cell from 5° C. to the upper limit 15° C. of the fluctuation range is calculated according to Formula (2) above. The smallest value of the two required charging times serves as the minimum charging time of the type-A battery cell at the $K^{th}$ charging phase, and a next charging phase is determined based on this.

In other embodiments, calculating the minimum charging time of a battery cell in the battery at the $K^{th}$ charging phase may be to calculate only the charging time of the battery cell at the current state-of-charge phase. The calculated charging time at the current state-of-charge phase is the minimum charging time of the battery cell at the $K^{th}$ charging phase. This is not limited in this application.

For ease of understanding the foregoing solution, the following description uses an example in which a battery includes two types of battery cells. Specifically, the battery includes a first type of battery cell and a second type of battery cell.

It needs to be noted that the following steps are applicable to both the first type of battery cell and the second type of battery cell.

Figure 3:
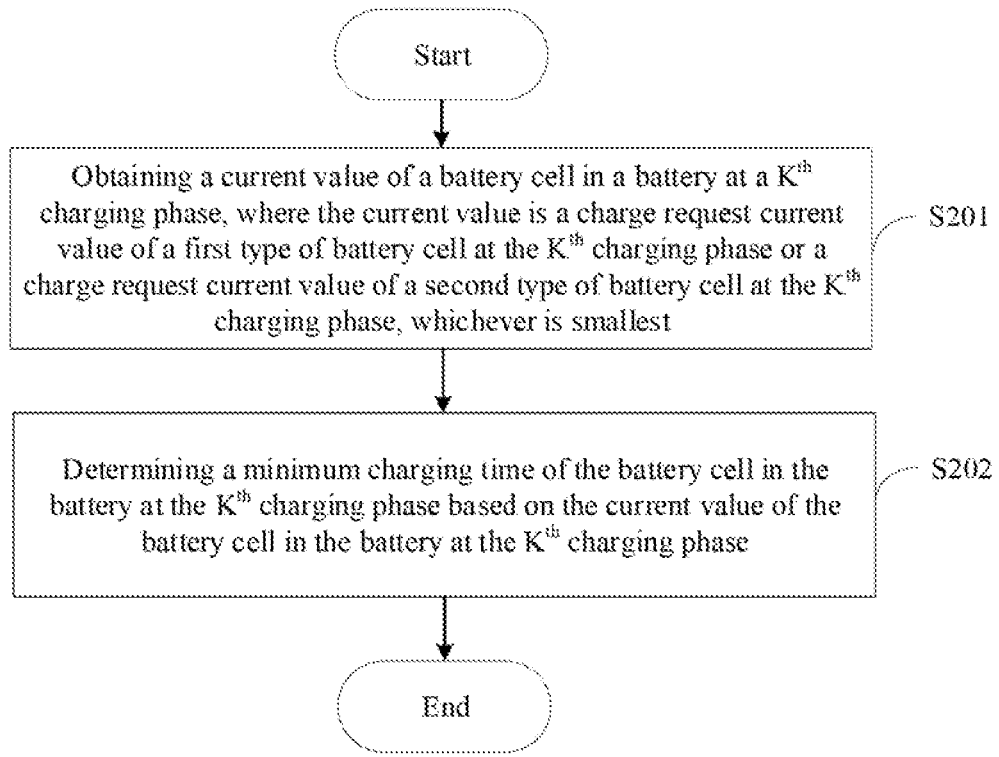
FIG. 3 is a flowchart of steps of another method for estimating a remaining charging time of a battery according to an embodiment of this application.

Referring to FIG. 3, determining a minimum charging time of a battery cell in a battery at a $K^{th}$ charging phase includes steps S201 to S202.

S201: Obtaining a current value of a battery cell in a battery at a $K^{th}$ charging phase, where the current value is a charge request current value of a first type of battery cell at the $K^{th}$ charging phase or a charge request current value of a second type of battery cell at the $K^{th}$ charging phase, whichever is smallest.

In this embodiment of this application, the smallest current value in charge requests of the two types of battery cells at the $K^{th}$ phase is used as a charge request current value ultimately requested by the battery at the $K^{th}$ phase. It is assumed that the charge request current value of the first type of battery cell at the $K^{th}$ charging phase is $I_1$, and the charge request current value of the second type of battery cell at the $K^{th}$ charging phase is $I_2$, where $I_1<I_2$. Therefore, $I_1$ is used as the charge request current value of the battery at the $K^{th}$ charging phase. The current value of the battery cells in the battery at the $K^{th}$ charging phase in this step is $I_1$.

Specifically, when K=1, the obtaining a current value of a battery cell in the battery at the $K^{th}$ charging phase includes: obtaining a current state of charge of the first type of battery cell and a current temperature of the first type of battery cell, where the current state of charge of the first type of battery cell is the initial state of charge of the first type of battery cell at the first charging phase, and the current temperature of the first type of battery cell is the initial temperature of the first type of battery cell at the first charging phase; obtaining a current state of charge of the second type of battery cell and a current temperature of the second type of battery cell, where the current state of charge of the second type of battery cell is the initial state of charge of the second type of battery cell at the first charging phase, and the current temperature of the second type of battery cell is the initial temperature of the second type of battery cell at the first charging phase; determining the charge request current value of the first type of battery cell at the first charging phase based on the current state of charge of the first type of battery cell and the current temperature of the first type of battery cell; and determining the charge request current value of the second type of battery cell at the first charging phase based on the current state of charge of the second type of battery cell and the current temperature of the second type of battery cell.

The current value of the battery cell in the battery at the first charging phase is the charge request current value of the first type of battery cell or the charge request current value of the second type of battery cell, whichever is smallest.

It needs to be noted that the charge request current value of each type of battery cell may be found in a pre-created two-dimensional table of charge request current values corresponding to states of charge and temperatures of the battery cell. Details of the table, which can be obtained by referring to Table 1, are not repeated herein.

Specifically, when K>1, the obtaining a current value of the battery cell in the battery at the $K^{th}$ charging phase includes: obtaining the minimum charging time of the first type of battery cell at a $(K-1)^{th}$ charging phase, the initial state of charge of the first type of battery cell at the $(K-1)^{th}$ charging phase, and the initial temperature of the first type of battery cell at the $(K-1)^{th}$ charging phase; obtaining the minimum charging time of the second type of battery cell at the $(K-1)^{th}$ charging phase, the initial state of charge of the second type of battery cell at the $(K-1)^{th}$ charging phase, and the initial temperature of the second type of battery cell at the $(K-1)^{th}$ charging phase; determining the initial state of charge and the initial temperature of the first type of battery cell at the $K^{th}$ charging phase based on the minimum charging time of the first type of battery cell at the $(K-1)^{th}$ charging phase, the initial state of charge of the first type of battery cell at the $(K-1)^{th}$ charging phase, and the initial temperature of the first type of battery cell at the $(K-1)^{th}$ charging phase; determining the initial state of charge and the initial temperature of the second type of battery cell at the $K^{th}$ charging phase based on the minimum charging time of the second type of battery cell at the $(K-1)$ charging phase, the initial state of charge of the second type of battery cell at the $(K-1)^{th}$ charging phase, and the initial temperature of the second type of battery cell at the $(K-1)^{th}$ charging phase; determining the charge request current value of the first type of battery cell at the $K^{th}$ charging phase based on the initial state of charge and the initial temperature of the first type of battery cell at the $K^{th}$ charging phase; and determining the charge request current value of the second type of battery cell at the $K^{th}$ charging phase based on the initial state of charge and the initial temperature of the second type of battery cell at the $K^{th}$ charging phase.

The current value of the battery cell in the battery at the $K^{th}$ charging phase is the charge request current value of the first type of battery cell at the $K^{th}$ charging phase or the charge request current value of the second type of battery cell at the $K^{th}$ charging phase, whichever is smallest.

In this way, continuity of the estimation at all phases is ensured, and estimation precision is improved.

S202: Determining the minimum charging time of the battery cell in the battery at the $K^{th}$ charging phase based on the current value of the battery cell in the battery at the $K^{th}$ charging phase.

Finally, the minimum charging time of the battery cell in the battery at the $K^{th}$ charging phase may be calculated based on the current value of the battery cell in the battery at the $K^{th}$ charging phase.

Optionally, this step may include: determining a temperature change rate of the battery cell in the battery based on the current value and the initial temperature of the battery cell in the battery at the $K^{th}$ charging phase; determining a required charging time of the battery cell in the battery at a current temperature phase based on the temperature change rate; and determining a required charging time of the battery cell in the battery at a current state-of-charge phase based on the current value of the battery cell in the battery at the $K^{th}$ charging phase, where the minimum charging time of the battery cell in the battery at the $K^{th}$ charging phase is the required charging time of the battery cell in the battery at the current temperature phase or the required charging time of the battery cell in the battery at the current state-of-charge phase, whichever is smallest.

It needs to be noted that the process of setting temperature phases and state-of-charge phases has been described in the preceding embodiment. For brevity, details are omitted here.

In other embodiments, calculating the minimum charging time of a battery cell in the battery at the $K^{th}$ charging phase may be to calculate only the charging time of the battery cell at the current state-of-charge phase. The calculated charging time at the current state-of-charge phase is the minimum charging time of the battery cell at the $K^{th}$ charging phase. This is not limited in this application.

Through the foregoing steps, the minimum charging times of the first type of battery cell and the second type of battery cell at the $K^{th}$ charging phase can be determined. When the $K^{th}$ charging phase of the first type of battery cell and the second type of battery cell is the target charging phase, the minimum charging times of each of the two types of battery cells in all charging phases are accumulated to obtain two accumulation values. A smallest one of the accumulation values is determined to be the remaining charging time of the battery.

The following uses a complete example to describe the method for estimating the remaining charging time of a battery containing two types of battery cells. The battery enters a charging state after being inserted into a charging pile, and a battery management system first obtains a current state of charge and a current temperature of the first type of battery cell as well as a current state of charge and a current temperature of the second type of battery cell. A current value at a first charging phase can be obtained based on the obtained data (the current value at the first charging phase is a charge request current value of the first type of battery cell at the first charging phase or a charge request current value of the second type of battery cell at the first charging phase, whichever is smallest. The charge request current value of each type of battery cell can be looked up in a table based on the current state of charge and the current temperature of this type of battery cell).

Subsequently, the battery management system determines a temperature change rate of the first type of battery cell based on the current value and an initial temperature of the first type of battery cell at the first charging phase; determines a required charging time of the first type of battery cell at a current temperature phase based on the temperature change rate; and determines required charging time of the first type of battery cell at a current state-of-charge phase based on the current value of the first type of battery cell at the first charging phase.

A minimum charging time of the first type of battery cell at the first charging phase is the required charging time of the first type of battery cell at the current temperature phase or the required charging time of the first type of battery cell at the current state-of-charge phase, whichever is smallest. (A minimum charging time of the second type of battery cell at the first charging phase is obtained in the same way).

Subsequently, based on the minimum charging time of the first type of battery cell and the second type of battery cell respectively, a state of charge reached by each type of battery cell after the battery cell undergoes the determined minimum charging time is determined. The battery management system determines whether the first charging phase of the first type of battery cell or the second type of battery cell is a target state-of-charge phase.

When the first charging phase of neither the first type of battery cell nor the second type of battery cell is the target state-of-charge phase, the battery management system calculates an initial temperature and an initial state of charge at a next charging phase based on state values (temperature, state of charge, and minimum charging time) of each type of battery cell at the first charging phase. The foregoing steps are repeated until a charging phase of the first type of battery cell or the second type of battery cell is the target state-of-charge phase, whereupon the remaining charging time of the battery determined. The remaining charging time of the battery is an accumulation value of minimum charging times of the first type of battery cell at all charging phases or an accumulation value of minimum charging times of the second type of battery cell at all charging phases, whichever is smallest. If the first charging phase of the first type of battery cell or the second type of battery cell is the target state-of-charge phase, the minimum charging time of the first type of battery cell or the minimum charging time of the second type of battery cell at the first charging phase, whichever is smaller, is directly determined to be the remaining charging time of the battery.

The remaining charging time of the battery keeps changing in a charging process. Therefore, the battery management system keeps repeating the foregoing steps until the charging is completed, and keeps determining the remaining charging time of the battery until the charging is completed.

In addition, after estimating the remaining charging time of the battery, the battery management system may send the remaining charging time to a device connected to the battery management system, so as to display the remaining charging time. For example, when the battery management system is installed on an electric vehicle, the battery management system may send the estimated remaining charging time of the battery to a display panel of the electric vehicle for displaying. For another example, when the battery management system is installed on an unmanned aerial vehicle, the battery management system may send the estimated remaining charging time of the battery to a remote control device that is connected in communication to the unmanned aerial vehicle, so as to display the remaining charging time. This is not limited in this application.

In addition, when the battery includes more than two types of battery cells, the estimation process may be the same as the estimation process performed in the case of two different types of battery cells. For example, the battery includes a first type of battery cell, a second type of battery cell, and a third type of battery cell. In this case, a minimum charging time of a battery cell in the battery at the $K^{th}$ charging phase is determined by performing steps including: obtaining a current value of the battery cell in the battery at the $K^{th}$ charging phase, where the current value is the charge request current value of the first type of battery cell at the $K^{th}$ charging phase, or the charge request current value of the second type of battery cell at the $K^{th}$ charging phase, or the charge request current value of the third type of battery cell at the $K^{th}$ charging phase, whichever is smallest; and determining the minimum charging time of the battery cell in the battery at the $K^{th}$ charging phase based on the current value of the battery cell in the battery at the $K^{th}$ charging phase.

The battery cell in the battery may be one of the first type of battery cell, the second type of battery cell, or the third type of battery cell.

Figure 4:
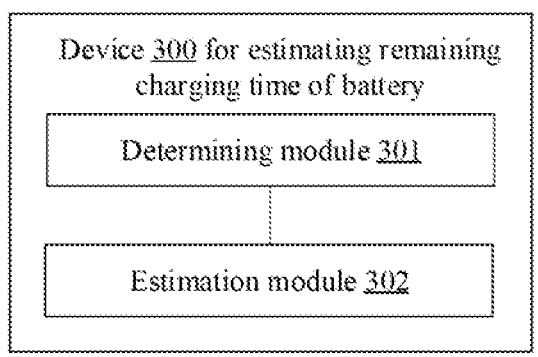
FIG. 4 is a modular block diagram of a device for estimating a remaining charging time of a battery according to an embodiment of this application.

Referring to FIG. 4, based on the same inventive conception, an embodiment of this application further provides a device 300 for estimating a remaining charging time of a battery. The battery includes N types of battery cells, N≥2, and the device includes: a determining module 301 and an estimation module 302.

The determining module 301 is configured to determine a minimum charging time of each type of battery cell at a $K^{th}$ charging phase based on a charge request current value of each type of battery cell at the $K^{th}$ charging phase, where the charge request current value of each type of battery cell at the $K^{th}$ charging phase is determined based on an initial state of charge and an initial temperature of said type of battery cell at said charging phase.

The estimation module 302 is configured to determine the remaining charging time of the battery when the $K^{th}$ charging phase of any type of battery cell in the battery is a target state-of-charge phase, where the remaining charging time of the battery is a smallest one of accumulation values, each accumulation value being an accumulation of minimum charging times of a type of battery cell in the battery at all charging phases.

Optionally, the determining module 301 is further configured to: when the $K^{th}$ charging phase of none of the battery cells in the battery is the target state-of-charge phase, determine the initial state of charge of each type of battery cell at a $(K+1)^{th}$ charging phase and the initial temperature of each type of battery cell at the $(K+1)^{th}$ charging phase based on the minimum charging time of each type of battery cell at the $K^{th}$ h charging phase, the initial state of charge of each type of battery cell at the $K^{th}$ charging phase, and the initial temperature of each type of battery cell at the $K^{th}$ charging phase; determine the charge request current value of each type of battery cell at the $(K+1)^{th}$ charging phase based on the initial state of charge of each type of battery cell at the $(K+1)^{th}$ charging phase and the initial temperature of each type of battery cell at the $(K+1)^{th}$ charging phase, and determine the minimum charging time of each type of battery cell at the $(K+1)^{th}$ charging phase based on the charge request current value of each type of battery cell at the $(K+1)^{th}$ charging phase.

Optionally, the battery includes a first type of battery cell and a second type of battery cell, and the determining module is configured to determine the minimum charging time of the battery cell in the battery at the $K^{th}$ charging phase. The battery cell in the battery is the first type of battery cell or the second type of battery cell. The determining module is specifically configured to: obtain a current value of the battery cell in the battery at the $K^{th}$ charging phase, where the current value is the charge request current value of the first type of battery cell at the $K^{th}$ charging phase or the charge request current value of the second type of battery cell at the $K^{th}$ charging phase, whichever is smallest; and determine the minimum charging time of the battery cell in the battery at the $K^{th}$ charging phase based on the current value of the battery cell in the battery at the $K^{th}$ charging phase.

Optionally, when K=1, the determining module is specifically configured to: obtain a current state of charge of the first type of battery cell and a current temperature of the first type of battery cell, where the current state of charge of the first type of battery cell is the initial state of charge of the first type of battery cell at the first charging phase, and the current temperature of the first type of battery cell is the initial temperature of the first type of battery cell at the first charging phase; obtain a current state of charge of the second type of battery cell and a current temperature of the second type of battery cell, where the current state of charge of the second type of battery cell is the initial state of charge of the second type of battery cell at the first charging phase, and the current temperature of the second type of battery cell is the initial temperature of the second type of battery cell at the first charging phase, determine the charge request current value of the first type of battery cell at the first charging phase based on the current state of charge of the first type of battery cell and the current temperature of the first type of battery cell; and determine the charge request current value of the second type of battery cell at the first charging phase based on the current state of charge of the second type of battery cell and the current temperature of the second type of battery cell, where the current value of the battery cell in the battery at the first charging phase is the charge request current value of the first type of battery cell or the charge request current value of the second type of battery cell, whichever is smallest.

Optionally, when K>1, the determining module is specifically configured to: obtain the minimum charging time of the first type of battery cell at a $(K-1)^{th}$ charging phase, the initial state of charge of the first type of battery cell at the $(K-1)^{th}$ charging phase, and the initial temperature of the first type of battery cell at the $(K-1)^{th}$ charging phase; obtain the minimum charging time of the second type of battery cell at the $(K-1)^{th}$ charging phase, the initial state of charge of the second type of battery cell at the $(K-1)^{th}$ charging phase, and the initial temperature of the second type of battery cell at the $(K-1)^{th}$ charging phase; determine the initial state of charge and the initial temperature of the first type of battery cell at the $K^{th}$ charging phase based on the minimum charging time of the first type of battery cell at the $(K-1)^{th}$ charging phase, the initial state of charge of the first type of battery cell at the $(K-1)^{th}$ charging phase, and the initial temperature of the first type of battery cell at the $(K-1)^{th}$ charging phase; determine the initial state of charge and the initial temperature of the second type of battery cell at the $K^{th}$ charging phase based on the minimum charging time of the second type of battery cell at the $(K-1)^{th}$ charging phase, the initial state of charge of the second type of battery cell at the $(K-1)^{th}$ charging phase, and the initial temperature of the second type of battery cell at the $(K-1)^{th}$ charging phase; determine the charge request current value of the first type of battery cell at the $K^{th}$ charging phase based on the initial state of charge and the initial temperature of the first type of battery cell at the $K^{th}$ charging phase; and determine the charge request current value of the second type of battery cell at the $K^{th}$ charging phase based on the initial state of charge and the initial temperature of the second type of battery cell at the $K^{th}$ charging phase, where the current value of the battery cell in the battery at the $K^{th}$ charging phase is the charge request current value of the first type of battery cell at the $K^{th}$ charging phase or the charge request current value of the second type of battery cell at the $K^{th}$ charging phase, whichever is smallest.

Optionally, the determining module is further specifically configured to: determine a temperature change rate of the battery cell in the battery based on the current value and the initial temperature of the battery cell in the battery at the $K^{th}$ charging phase; determine a required charging time of the battery cell in the battery at a current temperature phase based on the temperature change rate; and determine a required charging time of the battery cell in the battery at a current state-of-charge phase based on the current value of the battery cell in the battery at the $K^{th}$ charging phase, where the minimum charging time of the battery cell in the battery at the $K^{th}$ charging phase is the required charging time of the battery cell in the battery at the current temperature phase or the required charging time of the battery cell in the battery at the current state-of-charge phase, whichever is smallest.

Optionally, the battery includes a first type of battery cell, a second type of battery cell, and a third type of battery cell, and the determining module is configured to determine the minimum charging time of the battery cell in the battery at the $K^{th}$ charging phase. The battery cell in the battery is one of the first type of battery cell, the second type of battery cell, or the third type of battery cell. The determining module is specifically configured to: obtain a current value of the battery cell in the battery at the $K^{th}$ charging phase, where the current value is the charge request current value of the first type of battery cell at the $K^{th}$ charging phase, or the charge request current value of the second type of battery cell at the $K^{th}$ charging phase, or the charge request current value of the third type of battery cell at the $K^{th}$ charging phase, whichever is smallest; and determine the minimum charging time of the battery cell in the battery at the $K^{th}$ charging phase based on the current value of the battery cell in the battery at the $K^{th}$ charging phase.

It needs to be noted that, it can be clearly understood by a person skilled in the art that for ease and brevity of description, a detailed working process of the foregoing system, device, and units described above can be obtained by referring to a corresponding process in the preceding method embodiment, and details are omitted.

Based on the same inventive conception, an embodiment of this application further provides a computer-readable storage medium on which a computer program is stored. When executed, the computer program performs the method provided in the foregoing embodiment.

The storage medium may be any available medium accessible to a computer, or a data storage device such as a server or data center that integrates one or more available media. The available media may be a magnetic medium (such as a floppy disk, a hard disk, or a magnetic tape), an optical medium (such as a DVD), or a semiconductor medium (such as a solid state disk (SSD)).

In the embodiments provided in this application, it is understandable that the disclosed device and method may be implemented by other means. The device embodiment described above is merely exemplary. For example, the unit division is merely division with respect to logical functions, and in actual implementations, the units may be divided in other manners. For another example, a plurality of units or components may be combined or integrated into another system, or some features may be ignored or not implemented. In addition, the displayed or discussed mutual couplings or direct couplings or communications connections may be implemented through some communications interfaces. The indirect couplings or communications connections between the devices or units may be implemented in electronic, mechanical or other forms.

In addition, the units described as discrete components above may be separated physically or not; and the components illustrated as units may be physical units or not, that is, they may be located in one place or distributed on a plurality of network elements. Some or all of the units may be selected according to actual needs to achieve the objectives of the solutions of the embodiments.

In addition, function modules in each embodiment of this application may be integrated together to form a stand-alone part, or each module may exist alone, or two or more modules may be integrated into a stand-alone part.

The relational terms herein such as first and second are used merely to differentiate one entity or operation from another, and do not necessarily require or imply any actual relationship or sequence between the entities or operations.

Although this application has been described with reference to exemplary embodiments, various improvements may be made to the embodiments without departing from the scope of this application, and the parts therein may be replaced with equivalents. Particularly, to the extent that no structural conflict exists, various technical features mentioned in various embodiments can be combined in any manner. This application is not limited to the specific embodiments disclosed herein, but includes all technical solutions falling within the scope of the claims.

What is claimed is:

1. A method for a battery management system to estimate remaining charging time of a battery, wherein the battery comprises N types of battery cell, N≥2, and a battery charging process comprises M charging phase, starting from a first charging phase, M≥1, wherein the method comprises:

at a $K^{th}$ charging phase, obtaining an initial state of charge and an initial temperature of each type of battery cell, wherein K≤M;

determining a charge request current value of each type of battery cell based on the initial state of charge and the initial temperature of the type of battery cell;

determining a minimum charging time of each type of battery cell at the $K^{th}$ charging phase based on the charge request current value of the type of battery cell; and when the $K^{th}$ charging phase is a target state-of-charge phase of any type of battery cell, determining that the remaining charging time of the battery is a smallest one of a plurality of accumulation values, each accumulation value being an accumulation of minimum charging times of a type of battery cell at the first to the $K^{th}$ charging phases; and charging the battery in accordance with the remaining charging time.

2. The method according to claim 1, wherein, when the $K^{th}$ charging phase is not the target state-of-charge phase of any type of battery cell in the battery, the method further comprises:

determining an initial state of charge of each type of battery cell at a $(K+1)^{th}$ charging phase and an initial temperature of each type of battery cell at the $(K+1)^{th}$ charging phase based on the minimum charging time of each type of battery cell at the $K^{th}$ charging phase, the initial state of charge of each type of battery cell at the $K^{th}$ charging phase, and the initial temperature of each type of battery cell at the $K^{th}$ charging phase;

determining a charge request current value of each type of battery cell at the $(K+1)^{th}$ charging phase based on the initial state of charge of each type of battery cell at the (K+1)$^{th}$ charging phase and the initial temperature of each type of battery cell at the (K+1)$^{th}$ charging phase; and determining the minimum charging time of each type of battery cell at the (K+1)$^{th}$ charging phase based on the charge request current value of each type of battery cell at the (K+1)$^{th}$ charging phase.

3. The method according to claim 1, wherein the battery comprises a first type of battery cell and a second type of battery cell, and a minimum charging time of a battery cell in the battery at the K$^{th}$ charging phase is determined by performing the following steps, obtaining a current value of the battery cell in the battery at the K$^{th}$ charging phase, wherein the current value is the smallest one of the charge request current value of the first type of battery cell at the K$^{th}$ charging phase ad the charge request current value of the second type of battery cell at the K$^{th}$ charging phase; and determining the minimum charging time of the battery cell in the battery at the K$^{th}$ charging phase based on the current value of the battery cell in the battery at the K$^{th}$ charging phase.

4. The method according to claim 3, wherein, when K=1, the obtaining the current value of the battery cell in the battery at the first charging phase comprises:

obtaining a current state of charge of the first type of battery cell and a current temperature of the first type of battery cell, wherein the current state of charge of the first type of battery cell is the initial state of charge of the first type of battery cell at the first charging phase, and the current temperature of the first type of battery cell is the initial temperature of the first type of battery cell at the first charging phase;

obtaining a current state of charge of the second type of battery cell and a current temperature of the second type of battery cell, wherein the current state of charge of the second type of battery cell is the initial state of charge of the second type of battery cell at the first charging phase, and the current temperature of the second type of battery cell is the initial temperature of the second type of battery cell at the first charging phase;

determining the charge request current value of the first type of battery cell at the first charging phase based on the current state of charge of the first type of battery cell and the current temperature of the first type of battery cell;

determining the charge request current value of the second type of battery cell at the first charging phase based on the current state of charge of the second type of battery cell and the current temperature of the second type of battery cell, and determining that the current value of the battery cell in the battery at the first charging phase is the smallest one of the charge request current value of the first type of battery cell and the charge request current value of the second type of battery cell.

5. The method according to claim 3, wherein, when K>1, the obtaining the current value of the battery cell in the battery at the K$^{th}$ charging phase comprises:

obtaining a minimum charging time of the first type of battery cell at a (K−1)$^{th}$ charging phase, an initial state of charge of the first type of battery cell at the (K−1)$^{th}$ charging phase, and an initial temperature of the first type of battery cell at the (K−1)$^{th}$ charging phase;

obtaining minimum charging time of the second type of battery cell at the (K−1)$^{th}$ charging phase, an initial state of charge of the second type of battery cell at the (K−1)$^{th}$ charging phase, and an initial temperature of the second type of battery cell at the (K−1)$^{th}$ charging phase;

determining the initial state of charge and the initial temperature of the first type of battery cell at the K$^{th}$ charging phase based on the minimum charging time of the first type of battery cell at the (K−1)$^{th}$ charging phase, the initial state of charge of the first type of battery cell at the (K−1)$^{th}$ charging phase, and the initial temperature of the first type of battery cell at the (K−1)$^{th}$ charging phase;

determining the initial state of charge and the initial temperature of the second type of battery cell at the K$^{th}$ charging phase based on the minimum charging time of the second type of battery cell at the (K−1)$^{th}$ charging phase, the initial state of charge of the second type of battery cell at the (K−1)$^{th}$ charging phase, and the initial temperature of the second type of battery cell at the (K−1)$^{th}$ charging phase;

determining the charge request current value of the first type of battery cell at the K$^{th}$ charging phase based on the initial state of charge and the initial temperature of the first type of battery cell at the K$^{th}$ charging phase;

determining the charge request current value of the second type of battery cell at the K$^{th}$ charging phase based on the initial state of charge and the initial temperature of the second type of battery cell at the K$^{th}$ charging phase; and determining that the current value of the battery cell in the battery at the K$^{th}$ charging phase is the smallest one of the charge request current value of the first type of battery cell at the K$^{th}$ charging phase and the charge request current value of the second type of battery cell at the K$^{th}$ charging phase.

6. The method according to claim 3, wherein the determining the minimum charging time of the battery cell in the battery at the K$^{th}$ charging phase based on the current value of the battery cell in the battery at the K$^{th}$ charging phase comprises:

determining a temperature change rate of the battery cell in the battery based on the current value and the initial temperature of the battery cell in the battery at the K$^{th}$ charging phase;

determining a required charging time of the battery cell in the battery at a current temperature phase based on the temperature change rate;

determining a required charging time of the battery cell in the battery at a current state-of-charge phase based on the current value of the battery cell in the battery at the K$^{th}$ charging phase; and determining that the minimum charging time of the battery cell in the battery at the K$^{th}$ charging phase is the smallest one of the required charging time of the battery cell in the battery at the current temperature phase and the required charging time of the battery cell in the battery at the current state-of-charge phase.

7. The method according to claim 1, wherein the battery comprises a first type of battery cell, a second type of battery cell, and a third type of battery cell, and a minimum charging time of g battery cell in the battery at the K$^{th}$ charging phase is determined by performing the following steps:

obtaining a current value of the battery cell in the battery at the K$^{th}$ charging phase, wherein the current value is the smallest one of the charge request current value of the first type of battery cell at the K$^{th}$ charging phase, the charge request current value of the second type of battery cell at the $K^{th}$ charging phase, and the charge request current value of the third type of battery cell at the $K^{th}$ charging phase, whichever is smallest; and determining the minimum charging time of the battery cell in the battery at the $K^{th}$ charging phase based on the current value of the battery cell in the battery at the $K^{th}$ charging phase.

8. A battery management system for managing charging of a battery, wherein the battery comprises N types of battery cell, N≥2, and a battery charging process comprises M charging phase, starting from a first charging phase, M≥1, the system comprising:

a processor, and a memory connected to the processor, wherein the memory is configured to store a program; and by executing the program stored in the memory, the processor is configured to:

at a $K^{th}$ charging phase, obtain an initial state of charge and an initial temperature of each type of battery cell, wherein K≤M;

determine a charge request current value of each type of battery cell based on the initial state of charge and the initial temperature of the type of battery cell;

determine a minimum charging time of each type of battery cell at the $K^{th}$ charging phase based on the charge request current value of the type of battery cell; and when the $K^{th}$ charging phase is a target state-of-charge phase of any type of battery cell, determine that the remaining charging time of the battery is a smallest one of a plurality of accumulation values, each accumulation value being an accumulation of minimum charging times of a type of battery cell at the first to the $K^{th}$ charging phases; and control charging of the battery in accordance with the remaining charging time.

9. The system according to claim 8, wherein, when the $K^{th}$ charging phase is not the target state-of-charge phase of any type of battery cells in the battery, the processor is further configured to:

determine an initial state of charge of each type of battery cell at a $(K+1)^{th}$ charging phase and al initial temperature of each type of battery cell at the $(K+1)^{th}$ charging phase based on the minimum charging time of each type of battery cell at the $K^{th}$ charging phase, the initial state of charge of each type of battery cell at the $K^{th}$ charging phase, and the initial temperature of each type of battery cell at the $K^{th}$ charging phase;

determine g charge request current value of each type of battery cell at the $(K+1)^{th}$ charging phase based on the initial state of charge of each type of battery cell at the $(K+1)^{th}$ charging phase and the initial temperature of each type of battery cell at the $(K+1)^{th}$ charging phase; and determine the minimum charging time of each type of battery cell at the $(K+1)^{th}$ charging phase based on the charge request current value of each type of battery cell at the $(K+1)^{th}$ charging phase.

10. The system according to claim 8, wherein the battery comprises a first type of battery cell and a second type of battery cell, and in determining a minimum charging time of a battery cell in the battery at the $K^{th}$ charging phase, the processor is configured to:

obtain a current value of the battery cell in the battery at the $K^{th}$ charging phase, wherein the current value is the smallest on of the charge request current value of the first type of battery cell at the $K^{th}$ charging phase and the charge request current value of the second type of battery cell at the $K^{th}$ charging phase; and determine the minimum charging time of the battery cell in the battery at the $K^{th}$ charging phase based on the current value of the battery cell in the battery at the $K^{th}$ charging phase.

11. The system according to claim 10, wherein when K=1, in obtaining the current value of the battery cell in the battery at the first charging phase, the processor is configured to:

obtain a current state of charge of the first type of battery cell and a current temperature of the first type of battery cell, wherein the current state of charge of the first type of battery cell is the initial state of charge of the first type of battery cell at the first charging phase, and the current temperature of the first type of battery cell is the initial temperature of the first type of battery cell at the first charging phase;

obtain a current state of charge of the second type of battery cell and a current temperature of the second type of battery cell, wherein the current state of charge of the second type of battery cell is the initial state of charge of the second type of battery cell at the first charging phase, and the current temperature of the second type of battery cell is the initial temperature of the second type of battery cell at the first charging phase;

determine the charge request current value of the first type of battery cell at the first charging phase based on the current state of charge of the first type of battery cell and the current temperature of the first type of battery cell;

determine the charge request current value of the second type of battery cell at the first charging phase based on the current state of charge of the second type of battery cell and the current temperature of the second type of battery cell; and determine that the current value of the battery cell in the battery at the first charging phase is the smallest one of the charge request current value of the first type of battery cell and the charge request current value of the second type of battery cell.

12. The system according to claim 10, when K>1, in obtaining the current value of the battery cell in the battery at the $K^{th}$ charging phase, the processor is configured to:

obtain a minimum charging time of the first type of battery cell at a $(K-1)^{th}$ charging phase, an initial state of charge of the first type of battery cell at the $(K-1)^{th}$ charging phase, and an initial temperature of the first type of battery cell at the $(K-1)^{th}$ charging phase;

obtain a minimum charging time of the second type of battery cell at the $(K-1)^{th}$ charging phase, an initial state of charge of the second type of battery cell at the $(K-1)^{th}$ charging phase, and an initial temperature of the second type of battery cell at the $(K-1)^{th}$ charging phase;

determine the initial state of charge and the initial temperature of the first type of battery cell at the $K^{th}$ charging phase based on the minimum charging time of the first type of battery cell at the $(K-1)^{th}$ charging phase, the initial state of charge of the first type of battery cell at the $(K-1)^{th}$ charging phase, and the initial temperature of the first type of battery cell at the $(K-1)^{th}$ charging phase;

determine the initial state of charge and the initial temperature of the second type of battery cell at the $K^{th}$ charging phase based on the minimum charging time of the second type of battery cell at the $(K-1)^{th}$ charging phase, the initial state of charge of the second type of battery cell at the $(K-1)^{th}$ charging phase, and the initial temperature of the second type of battery cell at the $(K-1)^{th}$ charging phase;

determine the charge request current value of the first type of battery cell at the $K^{th}$ charging phase based on the initial state of charge and the initial temperature of the first type of battery cell at the $K^{th}$ charging phase; and determining the charge request current value of the second type of battery cell at the $K^{th}$ charging phase based on the initial state of charge and the initial temperature of the second type of battery cell at the $K^{th}$ charging phase; and determine that the current value of the battery cell in the battery at the $K^{th}$ charging phase is the smallest one of the charge request current value of the first type of battery cell at the $K^{th}$ charging phase and the charge request current value of the second type of battery cell at the $K^{th}$ charging phase.

13. The system according to claim 10, wherein in determining the minimum charging time of the battery cell in the battery at the $K^{th}$ charging phase based on the current value of the battery cell in the battery at the $K^{th}$ charging phase, the processor is configured to:

determine a temperature change rate of the battery cell in the battery based on the current value and the initial temperature of the battery cell in the battery at the $K^{th}$ charging phase;

determine a required charging time of the battery cell in the battery at a current temperature phase based on the temperature change rate;

determine a required charging time of the battery cell in the battery at a current state-of-charge phase based on the current value of the battery cell in the battery at the $K^{th}$ charging phase; and determine that the minimum charging time of the battery cell in the battery at the $K^{th}$ charging phase is the smallest one of the required charging time of the battery cell in the battery at the current temperature phase and the required charging time of the battery cell in the battery at the current state-of-charge phase.

14. The system according to claim 8, wherein the battery comprises a first type of battery cell, a second type of battery cell, and a third type of battery cell, and in determining a minimum charging time of a battery cell in the battery at the $K^{th}$ charging phase, the processor is configured to:

obtain a current value of the battery cell in the battery at the $K^{th}$ charging phase, wherein the current value is the smallest one of the charge request current value of the first type of battery cell at the $K^{th}$ charging phase, the charge request current value of the second type of battery cell at the $K^{th}$ charging phase, md the charge request current value of the third type of battery cell at the $K^{th}$ charging phase, whichever is smallest; and determine the minimum charging time of the battery cell in the battery at the $K^{th}$ charging phase based on the current value of the battery cell in the battery at the $K^{th}$ charging phase.

15. A non-transitory computer-readable storage medium, configured to store a computer program which, when executed by a processor in a computer, the computer performs a method for estimating a remaining charging time of a battery, wherein the battery comprises N types of battery cell, $N \geq 2$, and a battery charging process comprises M charging phase, starting from a first charging phase, $M \geq 1$, wherein the method comprises:

at a $K^{th}$ charging phase, obtaining an initial state of charge and an initial temperature of each type of battery cell, wherein $K \leq M$;

determining a charge request current value of each type of battery cell based on the initial state of charge and the initial temperature of the type of battery cell;

determining a minimum charging time of each type of battery cell at t $K^{th}$ charging phase based on the charge request current value of the type of battery cell;

when the $K^{th}$ charging phase is a target state-of-charge phase of any type of battery cell, determining that the remaining charging time of the battery is a smallest one of a plurality of accumulation values, each accumulation value being an accumulation of minimum charging times of a type of battery cell at the first to the $K^{th}$ charging phases; and charging the battery in accordance with the remaining charging time.

* * * * *